United States Patent
Zhang et al.

(10) Patent No.: US 12,142,643 B2
(45) Date of Patent: Nov. 12, 2024

(54) MATERIAL STRUCTURE FOR LOW THERMAL RESISTANCE SILICON-BASED GALLIUM NITRIDE MICROWAVE AND MILLIMETER-WAVE DEVICES AND MANUFACTURING METHOD THEREOF

(71) Applicant: Xidian University, Xi'an (CN)

(72) Inventors: Jincheng Zhang, Xi'an (CN); Lu Hao, Xi'an (CN); Zhihong Liu, Xi'an (CN); Junwei Liu, Xi'an (CN); Kunlu Song, Xi'an (CN); Yachao Zhang, Xi'an (CN); Weihang Zhang, Xi'an (CN); Yue Hao, Xi'an (CN)

(73) Assignee: Xidian University, Xi'an (CN)

( * ) Notice: Subject to any disclaimer, the term of this patent is extended or adjusted under 35 U.S.C. 154(b) by 710 days.

(21) Appl. No.: 17/282,190

(22) PCT Filed: Mar. 5, 2021

(86) PCT No.: PCT/CN2021/079283
§ 371 (c)(1),
(2) Date: Apr. 1, 2021

(87) PCT Pub. No.: WO2022/041674
PCT Pub. Date: Mar. 3, 2022

(65) Prior Publication Data
US 2022/0310796 A1    Sep. 29, 2022

(30) Foreign Application Priority Data
Aug. 25, 2020    (CN) .......................... 202010864740.5

(51) Int. Cl.
*H01L 29/20* (2006.01)
*H01L 23/367* (2006.01)
(Continued)

(52) U.S. Cl.
CPC ...... *H01L 29/2003* (2013.01); *H01L 23/3738* (2013.01); *H01L 29/0684* (2013.01);
(Continued)

(58) Field of Classification Search
CPC ............. H01L 29/2003; H01L 29/0684; H01L 29/872; H01L 23/367
See application file for complete search history.

(56) References Cited

U.S. PATENT DOCUMENTS 5,729,052 A * 3/1998 Tonti ........................ H01L 24/32
257/E29.022
6,281,573 B1 * 8/2001 Atwood .............. H01L 23/3675
257/710
(Continued)

OTHER PUBLICATIONS

A. Pantellini, A. Nanni, C. Lanzieri, Thermal Behavior of AlGaN/GaN HEMT on Silicon Microstrip Technology, Proceedings of the 6th European Microwave Integrated Circuits Conference, Oct. 10-11, 2011, pp. 132-135.
(Continued)

*Primary Examiner* — David A Zarneke

(57) ABSTRACT

A material structure for silicon-based gallium nitride microwave and millimeter-wave devices and a manufacturing method thereof are provided. The material structure includes: a silicon substrate; a dielectric layer of high thermal conductivity, disposed on an upper surface of the silicon substrate, and an uneven first patterned interface being formed between the dielectric layer and the silicon substrate; a buffer layer, disposed on an upper surface of the dielectric layer, and an uneven second patterned interface being formed between the buffer layer and the dielectric layer; a channel layer, disposed on an upper surface of the buffer layer; and a composite barrier layer, disposed on an upper surface of the channel layer. In the material structure, the uneven patterned interfaces increase contact areas of the
(Continued)

interfaces, a thermal boundary resistance and a thermal resistance of device are reduced, and a heat dissipation performance of device is improved.

16 Claims, 11 Drawing Sheets

(51) Int. Cl.
    *H01L 23/373*     (2006.01)
    *H01L 29/06*     (2006.01)
    *H01L 29/778*     (2006.01)
    *H01L 29/872*     (2006.01)

(52) U.S. Cl.
    CPC .......... *H01L 23/367* (2013.01); *H01L 29/778* (2013.01); *H01L 29/872* (2013.01)

(56) References Cited

U.S. PATENT DOCUMENTS

| | | | | |
|---|---|---|---|---|
| 7,071,526 B2* | 7/2006 | Ando | ..................... | H01L 29/475 |
| | | | | 257/E29.253 |
| 7,170,111 B2* | 1/2007 | Saxler | ................ | H01L 29/66462 |
| | | | | 257/E29.093 |
| 7,388,236 B2* | 6/2008 | Wu | ..................... | H01L 29/7787 |
| | | | | 257/E29.127 |
| 7,851,284 B2* | 12/2010 | Zhang | ................. | H01L 29/7783 |
| | | | | 257/E29.246 |
| 8,545,629 B2* | 10/2013 | Schowalter | ............. | C30B 25/16 |
| | | | | 117/952 |
| 9,978,661 B2* | 5/2018 | Im | ........................ | H01L 23/552 |
| 2006/0209516 A1* | 9/2006 | Chengalva | ............ | H01L 23/367 |
| | | | | 257/E23.09 |
| 2008/0073070 A1* | 3/2008 | Kuo | ...................... | H01L 23/367 |
| | | | | 257/722 |

OTHER PUBLICATIONS

N. Tsurumi, H. Ueno, T. Murata, H. Ishida, Y. Uemoto, T. Ueda, K. Inoue, T. Tanaka, AlN Passivation Over AlGaN/GaN HFETs for Surface Heat Spreading, IEEE Transactions on Electron Devices, May 2010, pp. 980-985, vol. 57, No. 5.

Z. Lin, C. Liu, C. Zhou, Y. Chai, M. Zhou, Y. Pei, Improved Performance of HEMTs with BN as Heat Dissipation, 2016 IEEE International Nanoelectronics Conference (INEC), Chengdu, 2016, pp. 1-2.

Marko J. Tadjer, Travis J. Anderson, Karl D. Hobart, Tatyana I. Feygelson, Joshua D. Caldwell, Charles R. Eddy Jr., Fritz J. Kub, James E. Butler, Bradford Pate, John Melngailis, Reduced Self-Heating in AlGaN/GaN HEMTs Using Nanocrystalline Diamond Heat-Spreading Films, IEEE Electron Device Letters, Jan. 2012, pp. 23-25, vol. 33, No. 1.

K. Belkacemi, R. Hocine, Efficient 3D-TLM Modeling and Simulation for the Thermal Management of Microwave AlGaN/GaN HEMT Used in High Power Amplifiers SSPA, Journal of Low Power Electronics and Applications, 2018, pp. 1-20, vol. 8, No. 23.

\* cited by examiner

MATERIAL STRUCTURE FOR LOW THERMAL RESISTANCE SILICON-BASED GALLIUM NITRIDE MICROWAVE AND MILLIMETER-WAVE DEVICES AND MANUFACTURING METHOD THEREOF

FIELD OF THE DISCLOSURE

The disclosure relates to the field of semiconductor devices, and more particularly to a material structure for low thermal resistance silicon-based gallium nitride microwave and millimeter-wave devices and a manufacturing/preparing method thereof.

BACKGROUND OF THE DISCLOSURE

With the development of microelectronics technologies, a third-generation wide bandgap semiconductor material represented by gallium nitride (GaN) has a large band gap, a high critical breakdown electric field, a high electron saturation drift velocity, a stable chemical performance, and physical properties such as high temperature resistance and radiation resistance. The use of a GaN material for preparing an electronic device can further reduce a chip area, increase an operating/working frequency, increase an operating temperature, reduce an on-resistance and increase a breakdown voltage. The GaN material has great potential in the preparation of microwave and millimeter-wave devices.

GaN, and aluminum gallium nitride (AlGaN), indium aluminum nitride (InAlN), etc., in the same material system as GaN, have high polarization coefficients. A heterostructure formed by GaN and AlGaN or InAlN having a bandgap larger than that of GaN can form a two-dimensional electron gas (2DEG), and can obtain an electron mobility higher than 1500 $cm^2/V \cdot s$, a saturated electron velocity up to $1.5 \times 10^7$ cm/s and a two-dimensional electron gas higher than $1 \times 10^{13}$ $cm^{-2}$ at room temperature. Therefore, high-speed Schottky barrier diodes (SBDs) and high electron mobility transistor (HEMT) devices developed based on GaN materials may have lower on-resistances and higher output currents. In addition, the high critical breakdown electric field intensity of the GaN material can make an electronic device have a higher breakdown voltage, so that the device can work at a higher working voltage and have a higher microwave output power density. Compared with a silicon microwave electronic device or a gallium arsenide (GaAs) microwave electronic device with the same output power, a GaN device may have higher power-added efficiency and thus lower energy loss.

Due to the immaturity of GaN self-supporting substrate technology, in current GaN microwave and millimeter-wave devices, GaN-based materials are mainly deposited on heterogeneous substrates. So far, substrates used for growths of GaN materials mainly are silicon carbide (SiC) and silicon. A SiC-based GaN device benefits from a small lattice mismatch between SiC and GaN and the high thermal conductivity of SiC, and thus can achieve low thermal resistance and high output power density. The research and development are relatively early and the technology is relatively mature. SiC-based GaN microwave devices have been widely used in military radar, satellites, communication base stations and other fields. However, limited by relatively high price and relatively small size of silicon carbide substrate, the cost of SiC-based GaN device is relatively high. A silicon-based GaN device has relatively low cost and high performance-cost ratio due to large-size and low-cost of silicon substrate wafer and large-scale production advantage of silicon production line. Silicon-based GaN microwave and millimeter-wave devices are potential to be widely used in mobile communication terminals such as 5G communication base stations and mobile phones in the future.

However, compared with the SiC-based GaN device, a main disadvantage of the silicon-based GaN device is that its thermal resistance is relatively high, resulting in poor heat dissipation performance, which limits the output power of silicon-based GaN microwave and millimeter-wave devices. Firstly, the thermal conductivity of the silicon substrate is relatively poor, and typically the thermal conductivity of the SiC substrate is 4.0 W/cm·K, while the thermal conductivity of the silicon substrate is only 1.5 W/cm·K. Secondly, when a GaN based material is epitaxially grown on the silicon substrate, because a lattice mismatch between silicon and the GaN crystal material is relatively large, it is necessary to insert very thick nucleation layer and transition layer, such as an AlGaN material with graded aluminum composition or an aluminum nitride/gallium nitride superlattice material, between the active structure of GaN device and the silicon substrate. The crystalline material of the nucleation layer and transition layer has relatively poor quality, excessive defects and poor thermal conductivity. Heat generated by the device itself cannot be dissipated in time by the buffer layer, the nucleation layer, the transition layer and the substrate, which causes heat to accumulate in the channel as a significant self-heating effect. Whether the self-heating effect of silicon-based GaN microwave and millimeter wave devices is serious or not depends on two aspects. A first aspect is the thermal conductivities of GaN channel and buffer layers, the nucleation layer, the transition layer and the substrate; and a second aspect is thermal boundary resistances among the layers. The thermal boundary resistance mainly describes a heat conduction process occurred between material boundaries, and its value is a reciprocal of a thermal boundary conductivity. Different thermal conductivities of boundary materials lead to a thermal coupling, and the propagation efficiency of phonons at the boundary determines the thermal boundary resistance (TBR). Moreover, a lattice mismatch and defects of the boundary would increase the TBR. The self-heating effect caused by a larger TBR would be more significant, and it is a main factor that limits the heat dissipation performance of the device, so it must be minimized to get a best performance of device.

At present, methods for improving heat dissipation performances of silicon-based GaN microwave and millimeter-wave devices mainly have several technical routes as follows:

1. after a device bare core process is completed, thinning the silicon substrate as much as possible, and then transferring the device with the thinned substrate to a heat sink with high thermal conductivity after dicing. At present, most of products of silicon-based GaN microwave and millimeter wave devices are to thin the silicon substrate to 100 μm, and a technology under development is to thin the silicon substrate to 50 μm. For example, A. Pantellini, A. Nanni, and C. Lanzieri have published a paper entitled "Thermal behavior of AlGaN/GaN HEMT on silicon Microstrip technology" on 6th European Microwave Integrated Circuit Conference on October 2011, in which a method is proposed to improve a heat dissipation performance of device by thinning a silicon substrate. However, a disadvantage of this method is that the process operation difficulty after thinning the silicon substrate is large, resulting in a decrease in the yield of device.

2. depositing layers of high thermal conductivity dielectric material on surfaces of silicon-based GaN microwave and millimeter-wave devices, for example, N. Tsurumi, H. Ueno, T. Murata, H. Ishida, Y. Uemoto, T. Ueda, K. Inoue and T. Tanaka have published a paper entitled "AlN Passivation Over AlGaN/GaN HFETs for Surface Heat Spreading" on IEEE Transactions on Electron Devices, Vol. 57, No. 5, pp. 980-985, May 2010, in which a layer of aluminum nitride is proposed to be deposited on a surface of a GaN microwave and millimeter wave device. Moreover, Z. Lin, C. Liu, C. Zhou, Y. Chai, M. Zhou and Y. Pei have published a paper entitled "Improved performance of HEMTs with BN as heat dissipation" on 2016 IEEE International Nanoelectronics Conference (INEC), Chengdu, 2016, pp. 1-2, in which a layer of boron nitride is proposed to be deposited on the surface of a silicon-based GaN microwave and millimeter wave device. In addition, Marko J. Tadjer, Travis J. Anderson, Karl D. Hobart, Tatyana I. Feygelson, Joshua D. Caldwell, Charles R. Eddy, Jr., Fritz J. Kub, James E. Butler, Bradford Pate and John Melngailis have published a paper entitled "Reduced self-heating in AlGaN/GaN HEMTs using nanocrystalline diamond Heat-spreading films" on IEEE electron device letters, Vol. 33. No. 1, pp. 23-25, January 2012, in which a layer of nanocrystalline diamond or the like is proposed to be deposited on the surface of a GaN microwave and millimeter wave device. However, these methods of depositing high thermal conductivity dielectric materials on the surfaces of GaN microwave and millimeter wave devices would have disadvantages that the high thermal conductivity materials often bring additional stresses, performances of the devices are affected or long-term reliabilities of the devices are degraded.

3. optimizing a layout design of a silicon-based GaN microwave and millimeter wave device, for example, K. Belkacemi and R. Hocine have published a paper entitled "Efficient 3D-TLM Modeling and Simulation for the Thermal Management of Microwave AlGaN/GaN HEMT Used in High Power Amplifiers SSPA" on Journal of Low Power Electronics and Applications, Vol. 8, No. 23, 1-19, 2018, in which a method is proposed to increase the gate finger pitch, reduce the gate density and thereby reduce the heat source density. However, a disadvantage of such method is that it would increase an area of the device, and the heat dissipation effect is not high.

In summary, how to improve the heat dissipation performance of silicon-based GaN microwave and millimeter-wave devices is still a problem that needs to be solved urgently.

SUMMARY OF THE DISCLOSURE

In order to solve one or more of the above-mentioned problems in the related art, the disclosure provides a material structure for low thermal resistance silicon-based GaN microwave and millimeter-wave devices and a manufacturing method thereof. A technical problem(s) to be solved by the disclosure can be realized by technical solutions as follows.

Specifically, a material structure for silicon-based GaN microwave and millimeter-wave devices as provided by an embodiment of the disclosure may include: a silicon substrate, a dielectric layer of high thermal conductivity, a buffer layer, a channel layer and a composite barrier layer. The dielectric layer is disposed on the upper surface of the silicon substrate, and an uneven first patterned interface is formed between the dielectric layer and the silicon substrate. The buffer layer is disposed on the upper surface of the dielectric layer, and an uneven second patterned interface is formed between the buffer layer and the dielectric layer. The channel layer is disposed on the upper surface of the buffer layer. The composite barrier layer is disposed on the upper surface of the channel layer.

In an embodiment of the disclosure, a material of the dielectric layer of high thermal conductivity may include aluminum nitride, boron nitride, silicon carbide or diamond; and a thickness of the dielectric layer is in a range of 20~20000 nm.

In an embodiment of the disclosure, each of the first patterned interface and the second patterned interface may include an interface formed with a plurality of grooves, and a ratio of an area of the plurality of grooves to an area of the interface formed with the plurality of grooves is in a range of 1%-99%.

In an embodiment of the disclosure, the plurality of grooves are arranged regularly, and shapes of the plurality of grooves include one or more of rectangle, triangle and trapezoid.

In an embodiment of the disclosure, the shapes of the plurality of grooves each are the rectangle, a depth of the rectangle is in a range of 10 nm~2000 nm, and a width of the rectangle is in a range of 10 nm~10 μm.

In an embodiment of the disclosure, a material of the buffer layer includes GaN, AlGaN, or aluminum nitride (AlN); a thickness of the buffer layer is in a range of 100~5000 nm, the material of the channel layer is GaN, and a thickness of the channel layer is in a range of 10~1000 nm.

In an embodiment of the disclosure, the composite barrier layer may include: an isolation layer, a core barrier layer, and a capping layer. The isolation layer is disposed on the upper surface of the channel layer, the core barrier layer is disposed on the upper surface of the isolation layer, and the capping layer is disposed on the upper surface of the capping layer.

In an embodiment of the disclosure, the composite barrier layer may include: an isolation layer and a core barrier layer. The isolation layer is disposed on the upper surface of the channel layer, and the core barrier layer is disposed on the upper surface of the isolation layer.

In an embodiment of the disclosure, the composite barrier layer may include: a core barrier layer and a capping layer. The core barrier layer is disposed on the upper surface of the channel layer, and the capping layer is disposed on the upper surface of the core barrier layer.

A manufacturing method of a material structure for silicon-based GaN microwave and millimeter-wave devices as provided by another embodiment of the disclosure includes steps of:

obtaining an initial substrate, a material of the initial substrate being a silicon base with a target crystal orientation;

sequentially forming a nucleation layer and a transition layer on the initial substrate in that order;

sequentially forming a buffer layer, a channel layer and a composite barrier layer on the transition layer in that order, to thereby obtain an intermediate structure;

reversing the intermediate structure, and forming a temporary substrate on the composite barrier layer by wafer bonding after the reversing;

removing the initial substrate, the nucleation layer and the transition layer to expose the buffer layer, after forming the temporary substrate;

etching a surface of the buffer layer to form a second patterned surface;

depositing a material of high thermal conductivity on the second patterned surface of the buffer layer to form a first portion of a dielectric layer;

etching a surface of a silicon substrate with a target crystal orientation to form a first patterned surface;

depositing a material of high thermal conductivity on the first patterned surface of the silicon substrate to form a second portion of the dielectric layer;

bonding the first portion of the dielectric layer with the second portion of the dielectric layer by wafer bonding to form the dielectric layer, and thereby forming an uneven first patterned interface between the dielectric layer and the silicon substrate, and forming an uneven second patterned interface between the dielectric layer and the buffer layer; and removing the temporary substrate.

Compared with the related art, embodiments of the disclosure can achieve beneficial effects as follows.

1. in the material structure for low thermal resistance silicon-based GaN microwave and millimeter-wave devices according to the disclosure, the uneven patterned interfaces are formed between the dielectric layer and the silicon substrate as well as between the dielectric layer and the buffer layer, contact areas of the interfaces are increased, thermal boundary resistances (TBRs) are reduced, thereby reducing thermal resistance of device and improving heat dissipation performance of device.

2. the material structure for low thermal resistance silicon-based GaN microwave and millimeter-wave devices according to the disclosure forms patterned interfaces between the dielectric layer and the buffer layer as well as between the dielectric layer and the silicon substrate. Compared with a planarized interface, the compressive stress between lattices is reduced, the material quality of the dielectric layer is improved, and the device quality is improved consequently.

3. the material structure for low thermal resistance silicon-based GaN microwave and millimeter-wave devices according to the disclosure employs the dielectric layer of high thermal conductivity to realize the bonding between the silicon substrate and the buffer layer, thus maintaining high bonding strength, high mechanical strength and high stability, being compatible with the existing production line, and having advantages of high yield and high reliability.

DETAILED DESCRIPTION OF EMBODIMENTS

The disclosure will be described in detail below with reference to specific embodiments, but embodiments of the disclosure are not limited to these.

Embodiment 1

Figure 1:
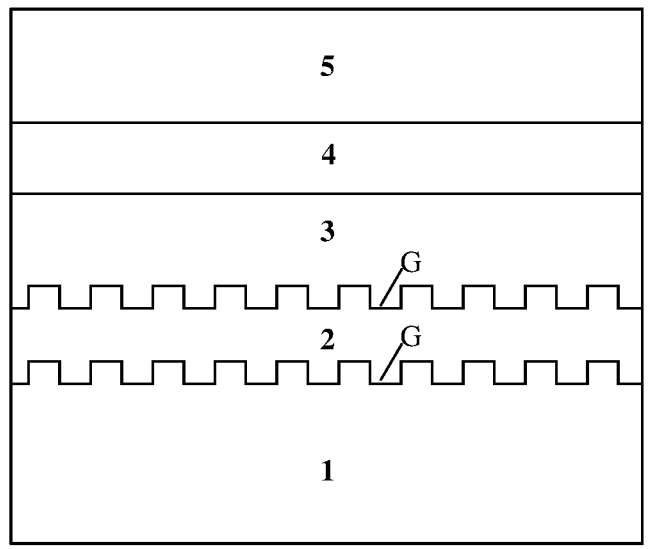
FIG. 1 is a schematic structural view of a material structure for low thermal resistance silicon-based GaN microwave and millimeter-wave devices according to the disclosure.

Referring to FIG. 1, and FIG. 1 is a schematic structural view of a material structure for low thermal resistance silicon-based GaN microwave and millimeter-wave devices according to the disclosure. The material structure for low thermal resistance silicon-based GaN microwave and millimeter-wave devices includes: a silicon substrate 1, a dielectric layer 2 of high thermal conductivity, a buffer layer 3, a channel layer 4 and a composite barrier layer 5.

The dielectric layer 2 is disposed on (for example, in contact with) the upper surface of the silicon substrate 1, and an uneven first patterned interface is formed between the dielectric layer 2 and the silicon substrate 1. The buffer layer 3 is disposed on (for example, in contact with) the upper surface of the dielectric layer 2, and an uneven second patterned interface is formed between the buffer layer 3 and the dielectric layer 2. The channel layer 4 is disposed on (for example, in contact with) the upper surface of the buffer layer 3. The composite barrier layer 5 is disposed on (for example, in contact with) the upper surface of the channel layer 4. As a result, the material structure for low thermal resistance silicon-based GaN microwave and millimeter-wave devices is formed/constituted.

In the above material structure of device, the first patterned interface and the second patterned interface have the same interface shape or have different interface shapes, as long as satisfy the uneven state.

In an exemplary embodiment, the first patterned interface and the second patterned interface each include the interface formed with several grooves G. The grooves G may be arranged regularly or arranged irregularly. The shape of each of the grooves G can be regular, such as rectangle, triangle, trapezoid, etc., or the shape of each of the grooves G is irregular instead. In a top view, a ratio of an area (e.g., opening area) of the grooves G to an area of the patterned interface is 1% to 99%. It can be understood that: the upper surface of the silicon substrate 1 may be provided with regularly or irregularly arranged grooves G to form the first patterned interface with the dielectric layer 2 of high thermal conductivity; and the lower surface of the buffer layer 3 is provided with regularly or irregularly arranged grooves G to form the second patterned interface with the dielectric layer 2 of high thermal conductivity.

As illustrated, the grooves G are regularly arranged, and the shape of each of the grooves G is rectangle. From the top view, the surface of device forms striped grooves. More specifically, when each of the groove G is rectangular in shape, a depth of the groove G may be 10~2000 nanometers (nm), and a width of the groove G may be 10 nm to 10 micrometers (μm).

In an exemplary embodiment, the silicon substrate 1 is a high-resistance silicon, a doping type thereof is n-type or p-type, and a resistivity is 3000~30000 Ω·cm. The crystal orientation of the silicon substrate 1 is [111]. Preferably, the resistivity of the silicon substrate 1 is 5000 Ω·cm.

In an exemplary embodiment, the material of the dielectric layer 2 of high thermal conductivity may include aluminum nitride, boron nitride, silicon carbide or diamond, and the thickness the dielectric layer 2 is 20~20000 nm. Preferably, the material of the dielectric layer 2 of high thermal conductivity is aluminum nitride, and the thickness of the dielectric layer 2 is 1000 nm.

In an exemplary embodiment, the material of the buffer layer 3 includes GaN, AlGaN or AlN, and the thickness of the buffer layer 3 is 100~5000 nm. Preferably, the material of the buffer layer 3 is GaN, and the thickness of the buffer layer 3 is 1000 nm.

In an exemplary embodiment, the material of the channel layer 4 is GaN, and the thickness of the channel layer 4 is 10~1000 nm. Preferably, the thickness of the channel layer 4 is 300 nm.

In the conventional material structure for silicon-based GaN microwave and millimeter-wave devices, due to the large lattice constant mismatch between the silicon substrate and the buffer layer, it is necessary to introduce an aluminum nitride nucleation layer and a transition layer. The transition layer can be AlGaN or AlN/GaN superlattice. However, the nucleation layer and the transition layer have very poor crystal qualities, high dislocation densities and relatively poor thermal conductivities, heat dissipation performances of the silicon-based GaN microwave and millimeter-wave power devices are seriously affected. Meanwhile, resulting from the large lattice mismatch between the silicon substrate and the GaN buffer layer, it is difficult to directly bond the two materials to form a stable material structure for silicon-based GaN microwave and millimeter-wave devices. In the illustrated embodiment, the dielectric layer 2 of high thermal conductivity is used to realize a bonding between the silicon substrate 1 and the buffer layer 3, which not only maintains high bonding strength, high mechanical strength and high stability for the material structure of device, but also reduces the thermal resistance of the material structure of device. Therefore, heat dissipation performances of the silicon-based GaN microwave and millimeter-wave devices are improved, the channel temperature of device is reduced, and the device performance is improved consequently.

In the material structure for silicon-based GaN microwave and millimeter-wave devices as provided in the illustrated embodiment, striped grooves are prepared between the dielectric layer of high thermal conductivity and the buffer layer as well as between the dielectric layer of high thermal conductivity and the silicon substrate, the patterned interfaces are formed consequently. Compared with a planarized interface, the striped grooves not only can reduce the compressive stress between crystal lattices, but also can increase the interface contact area of the dielectric layer of high thermal conductivity with the buffer layer, as well as the interface contact area of the dielectric layer of high thermal conductivity with the silicon substrate, so that thermal boundary resistances (TBRs) can be reduced, thereby reducing the thermal resistance of device, lowering the channel temperature of device, and improving the heat dissipation performance of silicon-based GaN microwave and millimeter-wave power devices.

Figure 2:
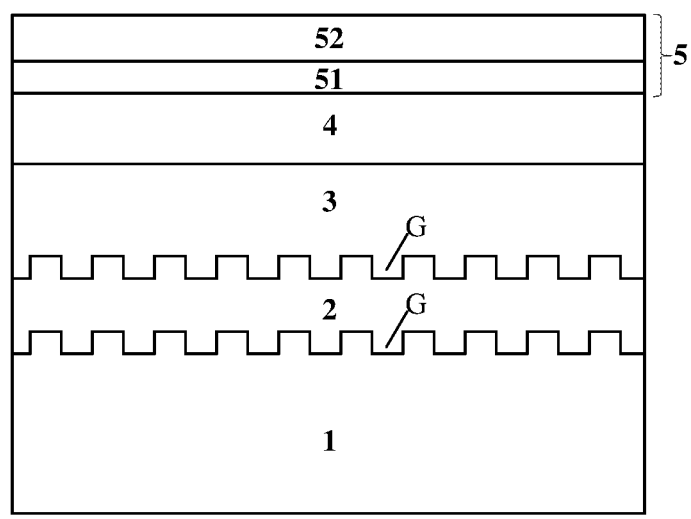
FIG. 2 is a schematic structural view of another material structure for low thermal resistance silicon-based GaN microwave and millimeter-wave devices according to the disclosure.

Referring to FIG. 2, and FIG. 2 is a schematic structural view of another material structure for low thermal resistance silicon-based GaN microwave and millimeter-wave devices according to the disclosure. The material structure includes: a silicon substrate 1, a dielectric layer 2 of high thermal conductivity, a buffer layer 3, a channel layer 4, and a composite barrier layer 5. Structures of the silicon substrate 1, the dielectric layer 2 of high thermal conductivity, the buffer layer 3 and the channel layer 4 can refer to FIG. 1 and thus will not be repeated.

The composite barrier layer 5 includes an isolation layer 51 and a core barrier layer 52. The isolation layer 51 is disposed on (for example, in contact with) the upper surface of the channel layer 4, and the core barrier layer 52 is disposed on (for example, in contact with) the upper surface of the isolation layer 51.

In an exemplary embodiment, the material of the isolation layer 51 is aluminum nitride, and the thickness of the isolation layer 51 is 0.5~1.5 nm. Preferably, the thickness of the isolation layer 51 is 1 nm.

In an exemplary embodiment, the material of the core barrier layer 52 is AlGaN, the content of aluminum is 0.2-0.4, and the thickness of the core barrier layer 52 is 10-30 nm; or the material of the core barrier layer 52 is indium aluminum nitride (InAlN), the content of indium is 0.1~0.2, and the thickness of the core barrier layer 52 is 5~30 nm; or the material of the core barrier layer 52 is aluminum nitride (AlN), and the thickness of the core barrier layer 52 is 2~10 nm. Preferably, the material of the core barrier layer 52 is AlGaN, the content of aluminum is 0.25, and the thickness of the core barrier layer 52 is 20 nm.

Figure 3:
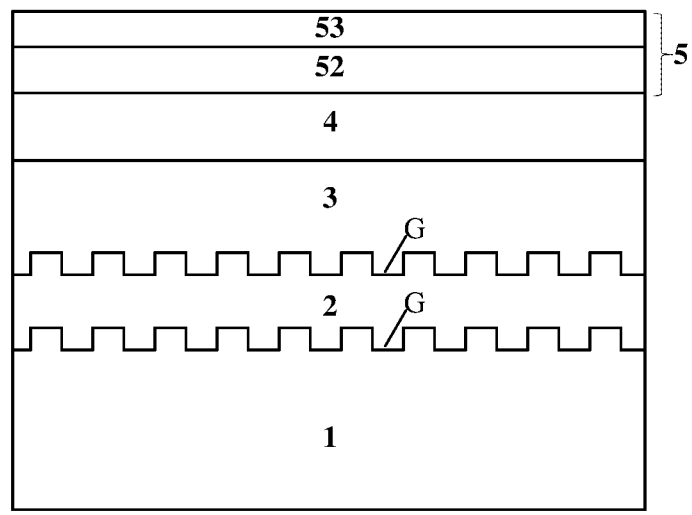
FIG. 3 is a schematic structural view of still another material structure for low thermal resistance silicon-based GaN microwave and millimeter-wave devices according to the disclosure.

Referring to FIG. 3, and FIG. 3 is a schematic structural view of still another material structure for low thermal resistance silicon-based GaN microwave and millimeter-wave devices according to the disclosure. The material structure may include: a silicon substrate 1, a dielectric layer 2 of high thermal conductivity, a buffer layer 3, a channel layer 4 and a composite barrier layer 5. Structures of the silicon substrate 1, the dielectric layer 2, the buffer layer 3 and the channel layer 4 can refer to FIG. 1, and thus will not be repeated.

The composite barrier layer 5 includes a core barrier layer 52 and a capping layer 53. The core barrier layer 52 is disposed on (for example, in contact with) the upper surface of the channel layer 4, and the capping layer 53 is disposed on (for example, in contact with) the upper surface of the core barrier layer 52.

In an exemplary embodiment, a material and a thickness of the core barrier layer 52 can refer to the material and the thickness of the core barrier layer 52 as shown in FIG. 2, and thus will not be repeated.

In an exemplary embodiment, the material of the capping layer 53 is GaN, and the thickness of the capping layer 53 is 1~3 nm; or the material of the capping layer 53 is silicon nitride, and the thickness of the capping layer 53 is 1~10 nm. Preferably, the material of the capping layer 53 is GaN, and the thickness of the capping layer 53 is 3 nm.

Figure 4:
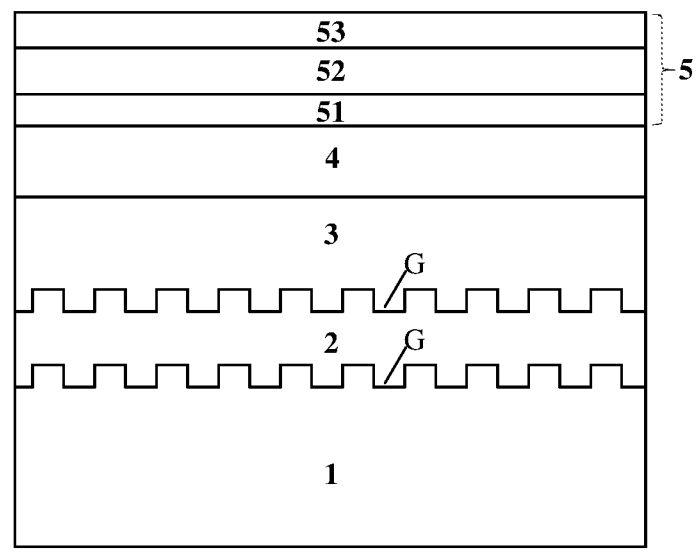
FIG. 4 is a schematic structural view of even still another material structure for low thermal resistance silicon-based GaN microwave and millimeter-wave devices according to the disclosure.

Referring to FIG. 4, and FIG. 4 is a schematic structural view of even still another material structure for low thermal resistance silicon-based GaN microwave and millimeter-wave devices according to the disclosure. The material structure may include: a silicon substrate 1, a dielectric layer 2 of high thermal conductivity, a buffer layer 3, a channel layer 4, and a composite barrier layer 5. Structures of the silicon substrate 1, the dielectric layer 2, the buffer layer 3 and the channel layer 4 can refer to FIG. 1, and thus will not be repeated.

The composite barrier layer 5 includes an isolation layer 51, a core barrier layer 52 and a capping layer 53. The isolation layer 51 is disposed on (for example, in contact with) the upper surface of the channel layer 4, the core barrier layer 52 is disposed on (for example, in contact with) the upper surface of the isolation layer 51, and the capping layer 53 is disposed on (for example, in contact with) the upper surface of the core barrier layer 52.

Materials and thicknesses of the isolation layer 51, the core barrier layer 52 and the capping layer 53 can refer to the materials and the thicknesses of the isolation layer 51, the core barrier layer 52 and the capping layer 53 shown in FIG. 2 and FIG. 3, and thus will not be repeated.

The material structure for silicon-based GaN microwave and millimeter-wave devices as provided by the embodiment of the disclosure forms patterned interfaces with the buffer layer and the silicon substrate respectively through the dielectric layer of high thermal conductivity, the thermal resistance of device can be reduced, and the thermal conductivity of device can be provided. The channel layer is disposed on the upper surface of the buffer layer and used for providing an electrically conductive channel for the device. The composite barrier layer is disposed on the upper surface of the channel layer to form a two-dimensional electron gap at the interface between the composite barrier layer and the channel layer as the electrically conductive channel of device. The arrangement of the isolation layer or the capping layer can further improve electrical characteristics of device.

Sum up, the material structure for low thermal resistance silicon-based GaN microwave and millimeter-wave devices as provided by the embodiment of the disclosure, when is used to prepare microwave and millimeter wave devices, can effectively reduce the thermal resistance of device and improve the heat dissipation performance of device, thereby improving performance indexes of device such as maximum output power and efficiency, and achieving good electrical characteristics. Meanwhile, it also has compatibility with the existing production line and gets advantages such as high yield and high reliability, and thus can be used in chips and systems of radio-frequency (RF), microwave, and millimeter-wave.

Embodiment 2

On the basis of the above embodiment 1, this embodiment provides a manufacturing method of a material structure for low thermal resistance silicon-based GaN microwave and millimeter-wave devices.

Figure 5:
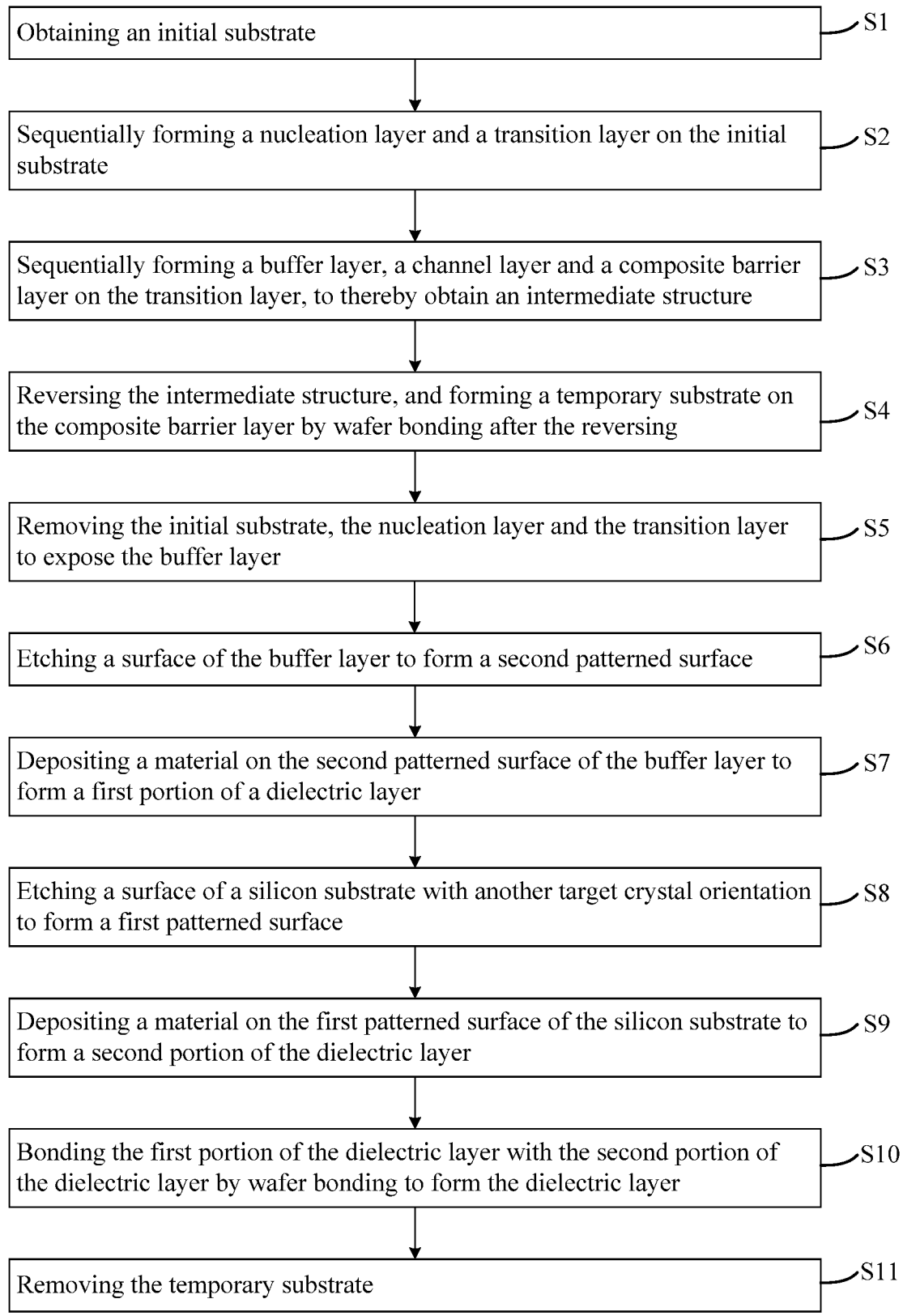
FIG. 5 is a schematic flowchart of a manufacturing method of a material structure for low thermal resistance silicon-based GaN microwave and millimeter-wave devices according to an embodiment of the disclosure.
Figure 6A:
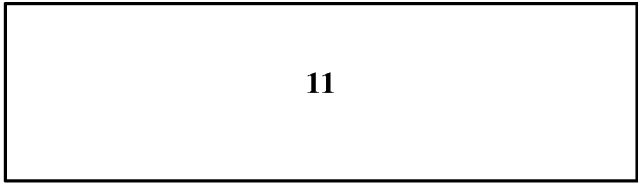
FIG. 6a through FIG. 6t are schematic structural views associated with a process of a manufacturing method of a material structure for low thermal resistance silicon-based GaN microwave and millimeter-wave devices according to an embodiment of the disclosure.
Figure 6B:
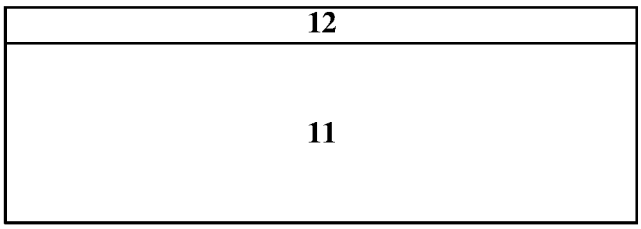
Figure 6C:
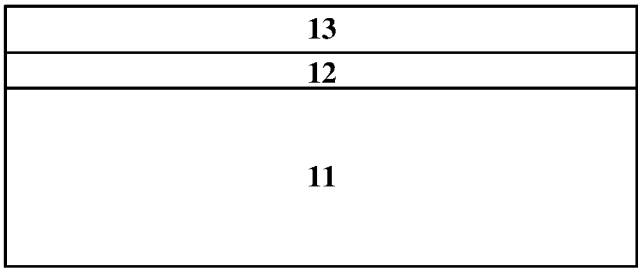
Figure 6D:
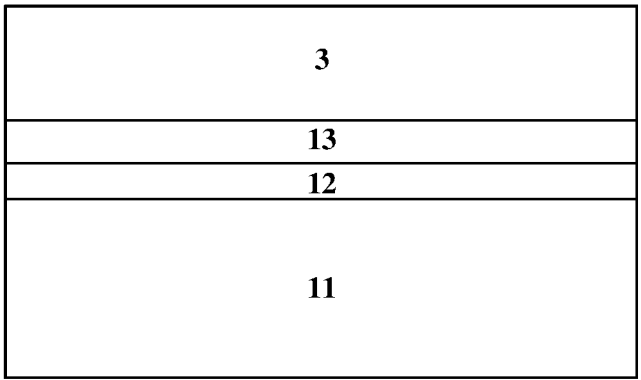
Figure 6E:
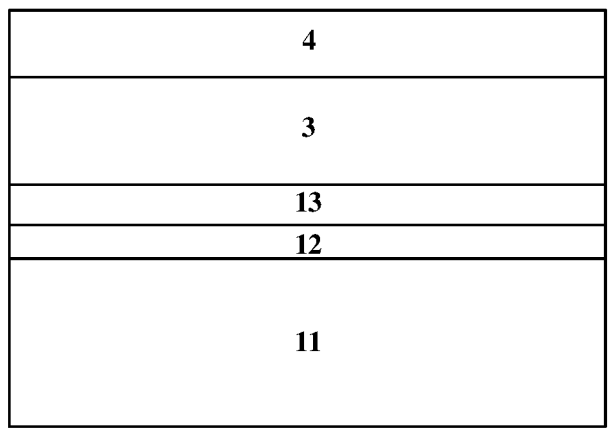
Figure 6F:
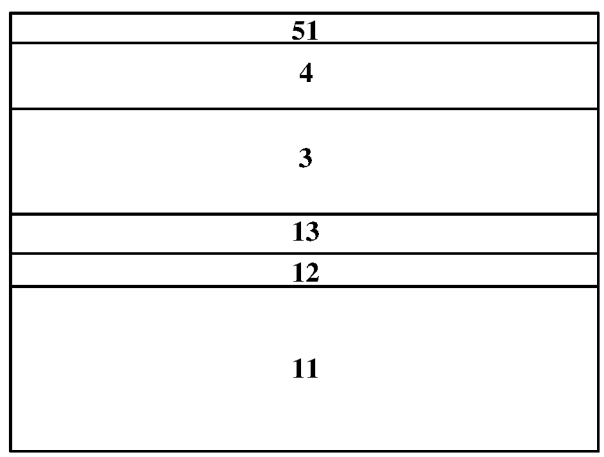
Figure 6G:
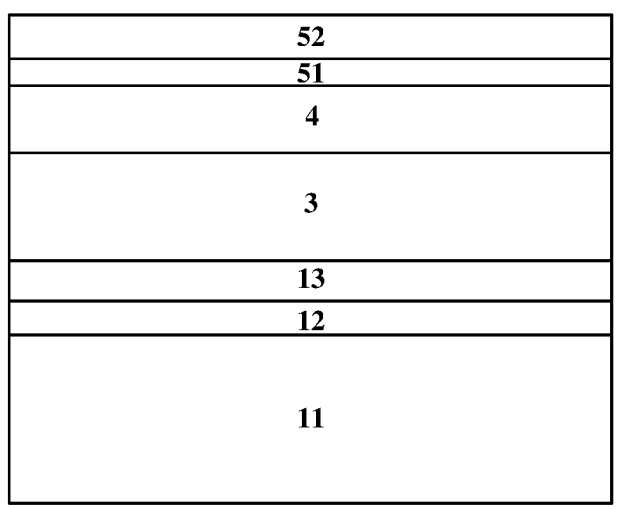
Figure 6H:
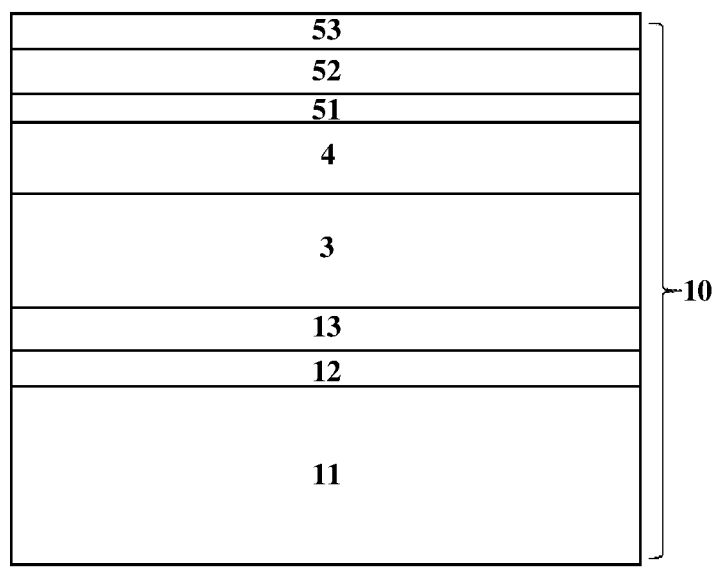
Figure 6I:
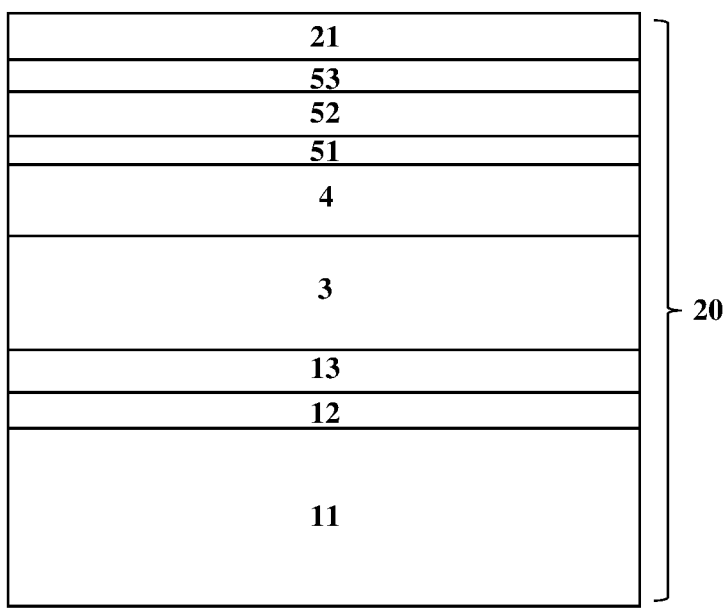
Figure 6J:
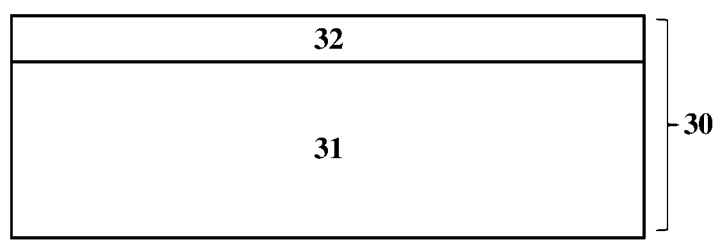
Figure 6K:
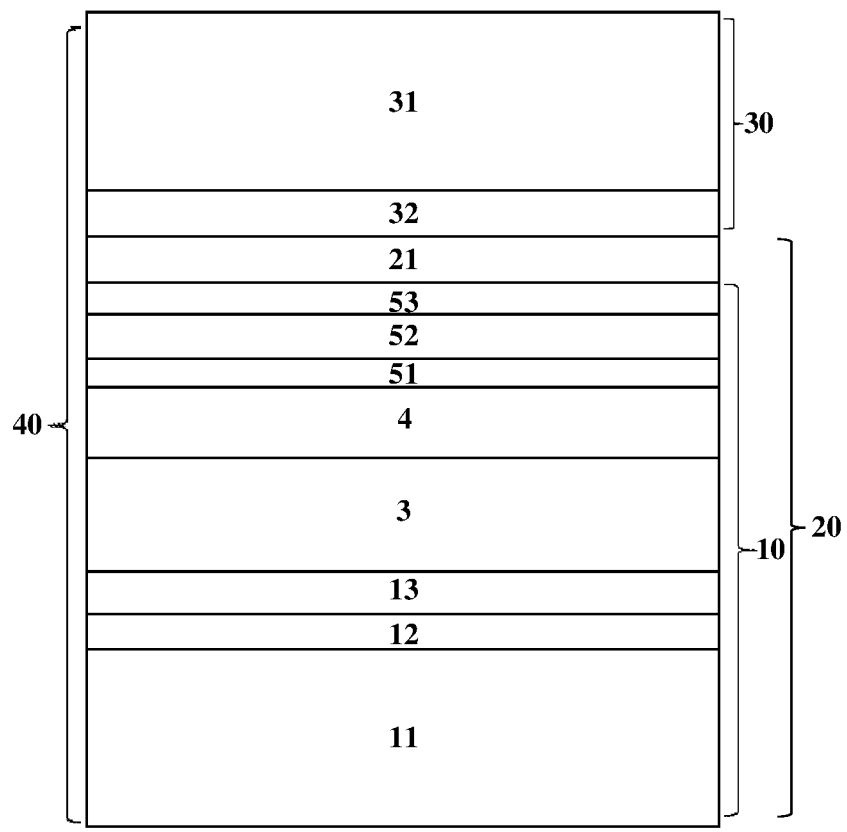
Figure 6L:
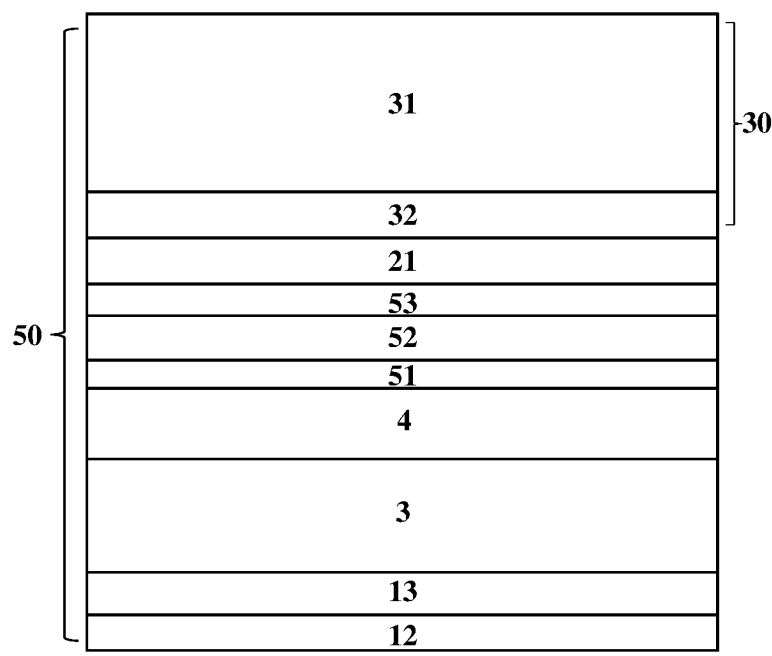
Figure 6M:
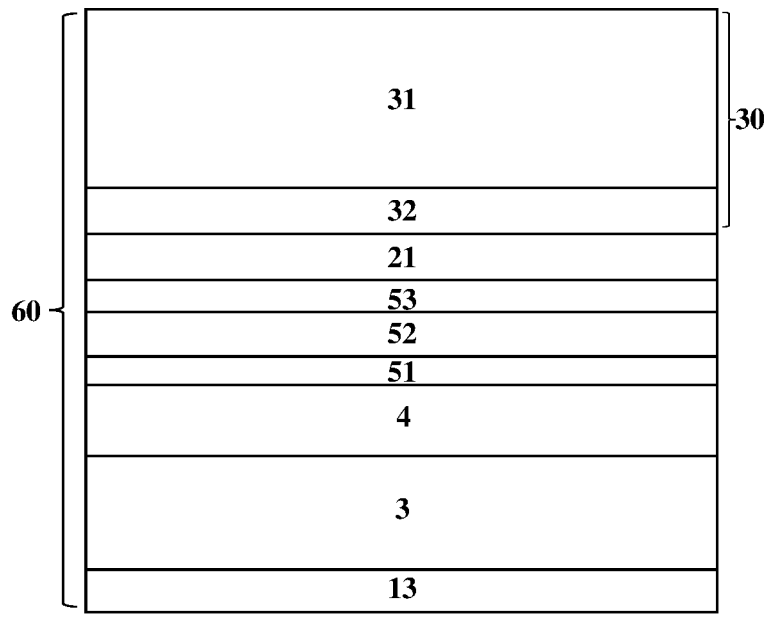
Figure 6N:
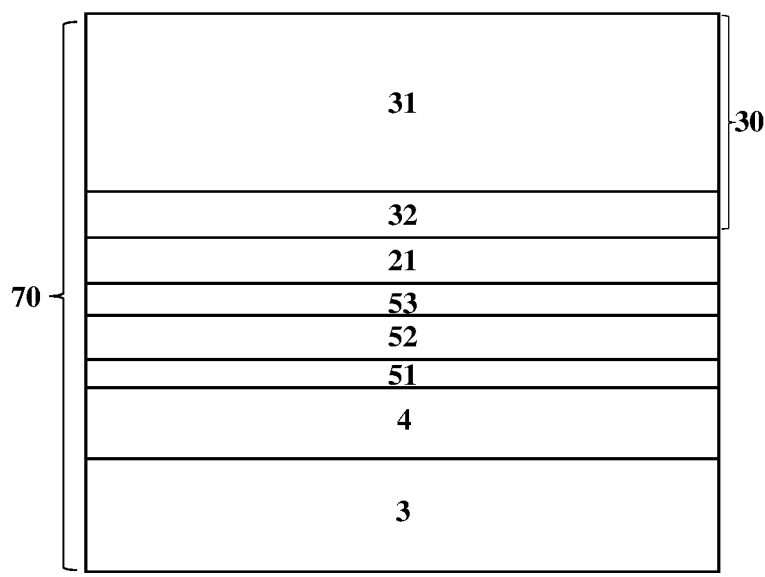
Figure 6O:
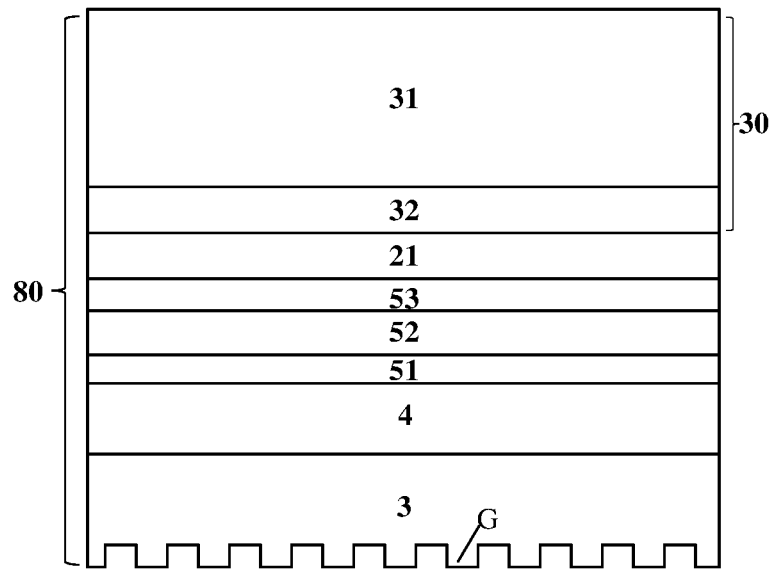
Figure 6P:
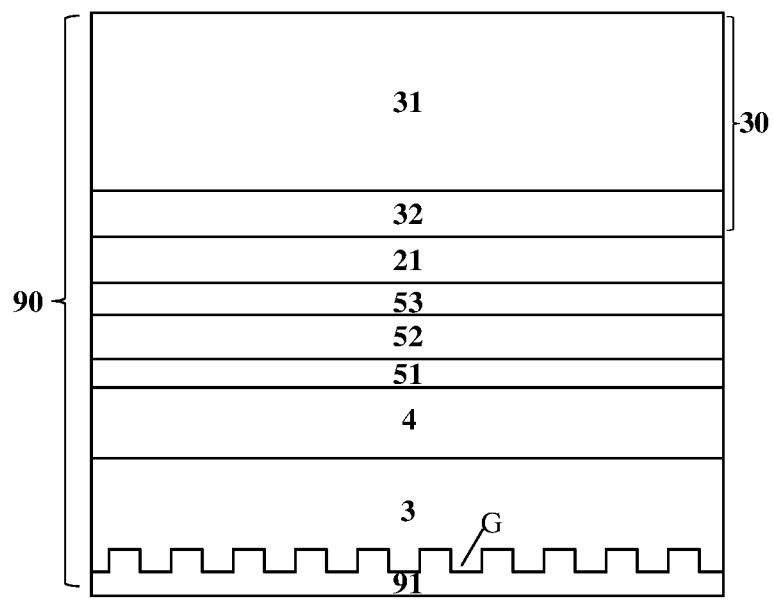
Figure 6Q:
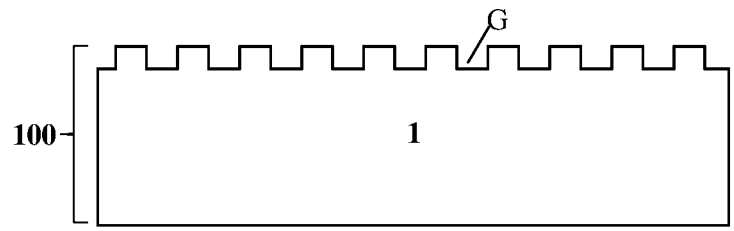
Figure 6R:
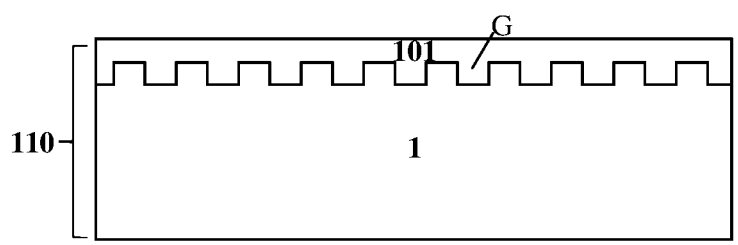
Figure 6S:
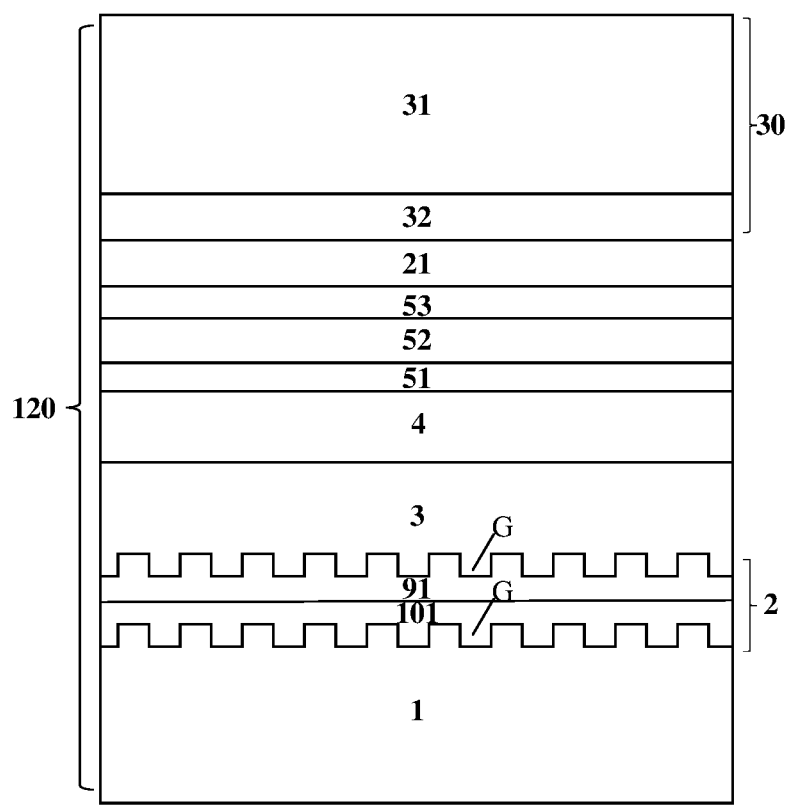
Figure 6T:
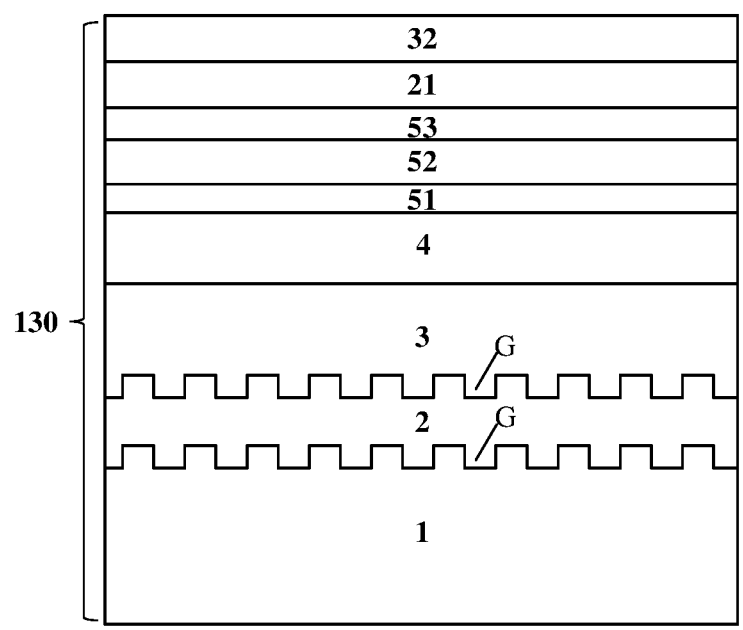

Referring to FIG. 5 and FIGS. 6a~6t, and FIG. 5 is a schematic flowchart of the manufacturing method of a material structure for low thermal resistance silicon-based GaN microwave and millimeter-wave devices, and FIGS. 6a~6t are schematic structural views associated with a process of the manufacturing method of a material structure for low thermal resistance silicon-based GaN microwave and millimeter-wave devices. The manufacturing method may include steps as follows.

S1, obtaining an initial substrate 11. A material of the initial substrate 11 may be a silicon base with a target crystal orientation, as shown in FIG. 6a.

The illustrated embodiment uses the silicon base with the target crystal orientation as the initial substrate 11, and the silicon base is a high resistance silicon substrate. In particular, the resistivity of the silicon base is 5000 Ω·cm, the crystal orientation of the silicon base is [111], the size of the silicon base is 8 inches, and the thickness of the silicon base is 725 μm.

S2, sequentially forming a nucleation layer 12 and a transition layer 13 on the initial substrate 11.

In the illustrated embodiment, it is necessary to form/prepare the nucleation layer 12 and the transition layer 13 on the initial substrate to facilitate subsequent preparation of a buffer layer 3.

In particular, firstly, the nucleation layer 12 is epitaxially grown on the initial substrate 11 by metal-organic chemical vapor deposition (MOCVD) equipment and technique. A material of the nucleation layer 12 may be an aluminum nitride material, and a thickness of the nucleation layer 12 may be 200 nm, as shown in FIG. 6b.

Secondly, the transition layer 13 is epitaxially grown on the nucleation layer 12 by the MOCVD equipment and technique. The material of the transition layer 13 may be an AlN/GaN superlattice material, and the thickness of the transition layer 13 may be 1000 nm, as shown in FIG. 6c.

S3, sequentially forming a buffer layer, a channel layer and a composite barrier layer on the transition layer in that order, to obtain an intermediate structure.

S31, forming the buffer layer 3 on the transition layer 13.

In particular, the buffer layer 3 is epitaxially grown on the transition layer 13 formed in step S2 by MOCVD equipment and technique. The buffer layer 3 may be an iron (Fe) doped buffer layer, the dislocation density of the buffer layer 3 may be $11 \times 10^9$ cm$^{-2}$, and the resistivity of the buffer layer 3 may be 1MΩ·cm, as shown in FIG. 6d.

S32, forming the channel layer 4 on the buffer layer 3.

In particular, the channel layer 4 is epitaxially grown on the buffer layer 3 by MOCVD equipment and technique. The channel layer 4 may be an unintentionally doped GaN channel layer, and the thickness of the channel layer 4 may be 300 nm, as shown in FIG. 6e.

S33, forming the composite barrier layer 5 on the channel layer 4.

Specifically, the composite barrier layer 5 may have several different structures. A first one of the structures includes an isolation layer 51 and a core barrier layer 52; a second one of the structures includes a core barrier layer 52 and a capping layer 53; and a third one of the structures includes an isolation layer 51, a core barrier layer 52 and a capping layer 53. In the illustrated embodiment, the composite barrier layer 5 including the isolation layer 51, the core barrier layer 52 and the capping layer 53 is taken as an example for illustrating the manufacturing method, and the manufacturing methods associated with the other two structures are similar to this.

Firstly, the isolation layer 51 is epitaxially grown on the channel layer 4 by using MOCVD equipment and technique. The material of the isolation layer 51 may be aluminum nitride, and the thickness of the isolation layer 51 is 1 nm, as shown in FIG. 6f.

Secondly, the core barrier layer 52 is epitaxially grown on the isolation layer 51 by using MOCVD equipment and technique. The core barrier layer 52 may be AlGaN with the content of aluminum being 0.25, and the thickness of the core barrier layer 52 may be 20 nm, as shown in FIG. 6g.

Thirdly, the capping layer 53 is epitaxially grown on the core barrier layer 52 by using MOCVD equipment and technique, and thereby the composite barrier layer 5 is formed consequently. The material of the capping layer 53 may be GaN, and the thickness of the capping layer 53 may be 3 nm, so that a first wafer 10 is formed as the intermediate structure, as shown in FIG. 6h.

In the illustrated embodiment, the nucleation layer, the transition layer, the buffer layer, the channel layer and the composite barrier layer are sequentially formed on the silicon base in that order. In an actual manufacturing process, in order to save the time and cost, a conventional silicon-based GaN epitaxial wafer including a silicon base, a nucleation layer, a transition layer, a buffer layer, a channel layer and a composite barrier layer can be selected directly instead for subsequent preparation process.

S4, reversing the intermediate structure formed as above (i.e., first wafer 10), and forming a temporary substrate on the reversed composite barrier layer 5 by wafer bonding.

S41, depositing a first silicon dioxide layer 21 with the thickness of 20 nm on the surface of the composite barrier layer 5, that is, the upper surface of the first wafer 10 obtained in step S3, by using plasma enhanced chemical vapor deposition (PECVD) equipment and technique, to thereby form a second wafer 20, as shown in FIG. 6i.

S42, obtaining a silicon wafer as a substrate.

In particular, a silicon wafer 31 with a target crystal orientation is selected. The resistivity of the silicon wafer 31 may be 10 Ω·cm, the target crystal orientation may be [100], the size of the silicon wafer 31 may be 8 inches, and the thickness of the silicon wafer 31 may be 725 μm.

A second silicon dioxide layer 32 with the thickness of 250 nm is deposited on the upper surface of the silicon wafer 31 by PECVD equipment and technique, to thereby form a third wafer 30, as shown in FIG. 6j.

S43, reversing the structure obtained in step 42, bonding surfaces of the first silicon dioxide layer 21 obtained in step S41 and the second silicon dioxide layer 32 obtained in step S42 together by wafer bonding, to form the temporary substrate (including the silicon wafer 31, the second silicon dioxide layer 32 and the first silicon dioxide layer 21) under the composite barrier layer, so that a fourth wafer 40 is obtained, as shown in FIG. 6k.

S5, removing the initial substrate 11, the nucleation layer 12 and the transition layer 13 to expose the buffer layer 3.

In particular, wet chemical etchings or plasma etchings are used to sequentially remove the initial substrate 11, the nucleation layer 12 and the transition layer 13, and thereby make the buffer layer 3 is exposed on the structure surface.

Firstly, the initial substrate 11 of the fourth wafer 40 obtained in step S43 is removed by using the wet chemical etching or plasma etching, to thereby obtain a fifth wafer 50, as shown in FIG. 6l.

Secondly, the nucleation layer 12 of the fifth wafer 50 as obtained is removed by using the wet chemical etching or plasma etching, to thereby obtain a sixth wafer 60, as shown in FIG. 6m.

Thirdly, the transition layer 13 of the sixth wafer 60 as obtained is removed by using the wet chemical etching or plasma etching, to thereby obtain a seventh wafer 70, as shown in FIG. 6n.

S6, etching the surface of the buffer layer to form a second patterned surface.

Specifically, a photolithography process and an etching process are performed to pattern the surface of the buffer layer 3 on the seventh wafer 70 obtained in step S5 to thereby obtain an uneven second patterned surface, so that an eighth wafer 80 is obtained, as shown in FIG. 6o.

The uneven second patterned surface may be a patterned surface with an array of grooves G. The grooves G may be arranged regularly, or arranged irregularly. The shape of each of the grooves G can be any regular shape such as rectangle, triangle, trapezoid, etc., or an irregular shape. When it is rectangular, a depth of the array of grooves G can be 10 nm~2000 nm, a width of each of the grooves G may be 10 nm~10 μm, and an area ratio of the grooves G may be 1%~99%. Preferably, the depth of the groove G is 500 nm, the width of the groove G is 1 μm, and the area ratio of the grooves G is 50%.

S7, depositing a material of high thermal conductivity on the second patterned surface of the buffer layer 3 to form a first portion of the dielectric layer 2 of high thermal conductivity.

In particular, the material of high thermal conductivity is deposited on the second patterned surface of the buffer layer 3 in the eighth wafer 80 obtained in step S6 by using magnetron sputtering equipment and technique, to form the first portion 91 of the dielectric layer 2 of high thermal conductivity. The thickness of the dielectric layer 2 of high thermal conductivity can be 20~20000 nm, and a ninth wafer 90 is obtained, as shown in FIG. 6p.

Preferably, the material for the dielectric layer 2 of high thermal conductivity is aluminum nitride, and the thickness thereof is 1 μm.

S8, etching a surface of a silicon substrate 1 with a target crystal orientation to form a first patterned surface.

In an exemplary embodiment, the size of the silicon substrate 1 is 8 inches, the thickness of the silicon substrate 1 is 725 μm, the resistivity of the silicone substrate 1 is 5000 Ω·cm, and the target crystal orientation is [111].

In an exemplary embodiment, photolithography and etching processes are carried out to pattern the upper surface of the silicon substrate 1 to thereby form a first patterned surface with an array of grooves, so that a tenth wafer 100 is obtained, as shown in FIG. 6q.

The uneven first patterned surface may be a patterned surface with an array of grooves G. The grooves G may be arranged regularly, or arranged irregularly. A shape of each of the grooves G can be any regular shape such as rectangle, triangle, trapezoid, etc., or an irregular shape. When it is rectangular, a depth of the array of grooves G can be 10 nm~2000 nm, a width of each of the grooves G may be 10 nm~10 μm, and an area ratio of the grooves G may be 1%~99%. Preferably, the depth of the groove G is 500 nm, the width of the groove G is 1 μm, and the area ratio of the grooves G is 50%.

S9, depositing a material of high thermal conductivity on the first patterned surface of the silicon substrate 1 to form a second portion 101 of the dielectric layer 2 of high thermal conductivity.

In particular, the material of high thermal conductivity is deposited on the first patterned surface of the silicon substrate of the tenth wafer 100 obtained in step S8 by using magnetron sputtering equipment and technique, to form the second portion 101 of the dielectric layer 2 of high thermal conductivity, so that an eleventh wafer 110 is fabricated/obtained, as shown in FIG. 6r.

The thickness of the dielectric layer 2 of high thermal conductivity may be 20~20000 nm. Preferably, the material for the dielectric layer 2 of high thermal conductivity is aluminum nitride, and the thickness thereof is 1 μm.

In the illustrated embodiment, the first patterned surface of the silicon substrate 1 correspondingly forms the first patterned interface between the dielectric layer 2 of high thermal conductivity and the silicon substrate 1, and the second patterned surface of the buffer layer 3 correspondingly forms the second patterned interface between the dielectric layer 2 of high thermal conductivity and the buffer layer 3.

S10, bonding the first portion 91 of the dielectric layer 2 of high thermal conductivity with the second portion 101 of the dielectric layer 2 of high thermal conductivity together by a wafer bonding technique, to form the dielectric layer 2 of high thermal conductivity, thereby forming an uneven first patterned interface between the dielectric layer 2 of high thermal conductivity and the silicon substrate 1, and forming an uneven second patterned interface between the dielectric layer 2 of high thermal conductivity and the buffer layer 3.

In particular, the first portion 91 of the dielectric layer 2 of high thermal conductivity in the ninth wafer 90 obtained in step S7 and the second portion 101 of the dielectric layer 2 of high thermal conductivity in the eleventh wafer 110 obtained in step S9 are bonded together by a wafer chemical bonding technique to obtain a dielectric layer of high thermal conductivity with double-sided patterned interface (i.e., with two patterned surfaces respectively located at two sides) between the buffer layer 3 and the silicon substrate 1, so that a twelfth wafer 120 is obtained, as shown in FIG. 6s.

For specific states of the first patterned interface and the second patterned interface, please refer to the above-described embodiment 1, which will not be repeated in this embodiment.

S11, removing the temporary substrate.

Specifically, wet chemical etchings or plasma etchings are used to sequentially remove the silicon wafer 31, the second silicon dioxide layer 21 and the first silicon dioxide layer 32 obtained in step S4, and finally a material structure for silicon-based GaN microwave and millimeter-wave devices is obtained.

Firstly, the silicon wafer 31 in the obtained eleventh wafer 110 is removed by the wet chemical etching or plasma etching, so that a thirteenth wafer 130 is obtained, as shown in FIG. 6t.

Secondly, the second silicon dioxide layer 32 and the first silicon dioxide layer 21 in the obtained thirteenth wafer 130 is removed by the wet chemical etching or plasma etching. As a result, the material structure for silicon-based GaN microwave and millimeter-wave devices in the illustrated embodiment is obtained, as shown in FIG. 4. The dielectric layer 2 of high thermal conductivity includes the first portion 91 and the second portion 101. In other words, the dielectric layer 2 includes a lower surface contacting with the silicon substrate 1 and an opposite upper surface contacting with the buffer layer 3 and is a bi-layered structure including the first portion 91 and the second portion 101 (referring to FIG. 6s); two opposite outer surfaces of the bi-layered structures are uneven surfaces with a plurality of grooves G and respectively serve as the lower surface and the upper surface of the dielectric layer 2.

So far, the preparation/fabrication of the material structure for silicon-based GaN microwave and millimeter wave devices is completed.

The manufacturing/preparing method as provided in the illustrated embodiment uses photolithography and etching processes to pattern the lower surface of the buffer layer and the upper surface of the silicon substrate to thereby form striped grooves, and then use the magnetron sputtering and wafer bonding to deposit the dielectric layer material of high thermal conductivity and form the patterned interfaces among the dielectric layer, the buffer layer and the silicon substrate. Compared with the planarized interface in the related art, the striped grooves not only can reduce compressive stresses between crystal lattices, but also can increase interface contact areas between the dielectric layer of high thermal conductivity and the buffer layer, as well as between the dielectric layer of high thermal conductivity and the silicon substrate. The thermal boundary resistances (TBRs) are reduced consequently, thereby reducing the thermal resistance of device, lowering the channel temperature of device, and improving heat dissipation performance of silicon-based GaN microwave and millimeter-wave power devices.

The above content is a further detailed description of the disclosure in combination with specific preferred embodiments, and it should not be considered that specific implementation of the disclosure is limited to these descriptions. For those of ordinary skill in the technical field to which the disclosure belongs, various simple deductions or substitutions can be made without departing from the concept of the disclosure and should be regarded as falling within the protection scope of the disclosure.

What is claimed is:

1. A material structure for silicon-based gallium nitride microwave and millimeter-wave devices, comprising:
    a silicon substrate;
    a dielectric layer, disposed on an upper surface of the silicon substrate, wherein an uneven first patterned interface is formed between the dielectric layer and the silicon substrate;
    a buffer layer, disposed on an upper surface of the dielectric layer, wherein an uneven second patterned interface is formed between the buffer layer and the dielectric layer;
    a channel layer, disposed on an upper surface of the buffer layer; and
    a composite barrier layer, disposed on an upper surface of the channel layer;
    wherein a surface of the silicon substrate disposed with the dielectric layer defines a plurality of first grooves to form the uneven first patterned interface, and the dielectric layer is filled into the plurality of first grooves and in contact with sides and bottoms of the plurality of first grooves; and
    a surface of the buffer layer provided with the dielectric layer defines a plurality of second grooves to form the uneven second patterned interface, and the dielectric layer is filled into the plurality of second grooves and in contact with sides and bottoms of the plurality of second grooves; and
    wherein the dielectric layer is a bi-layered structure, and comprises: a first portion and a second portion which are made from a same material and bonded together by wafer bonding; and a side of the first portion is in contact with the surface of the buffer layer, an opposite side of the first portion is in contact with a side of the second portion, and an opposite side of the second portion is in contact with the surface of the silicon substrate.

2. The material structure for silicon-based gallium nitride microwave and millimeter-wave devices as claimed in claim 1, wherein a material of the dielectric layer comprises aluminum nitride, boron nitride, silicon carbide or diamond; and a thickness of the dielectric layer is in a range of 20 to 20000 nm.

3. The material structure for silicon-based gallium nitride microwave and millimeter-wave devices as claimed in claim 1, wherein a ratio of an area of the plurality of first grooves to an area of the surface of the silicon substrate disposed with the dielectric layer is in a range of 1% to 99%; and a ratio of an area of the plurality of second grooves to an area of the surface of the buffer layer disposed with the dielectric layer is in a range of 1% to 99%.

4. The material structure for silicon-based gallium nitride microwave and millimeter-wave devices as claimed in claim 3, wherein the plurality of first grooves are arranged regularly, and shapes of the plurality of first grooves comprise one or more of rectangle, triangle and trapezoid; and the plurality of second grooves are arranged regularly, and shapes of the plurality of second grooves comprise one or more of rectangle, triangle and trapezoid.

5. The material structure for silicon-based gallium nitride microwave and millimeter-wave devices as claimed in claim 4, wherein the shapes of the plurality of first and second grooves each are the rectangle, a depth of the rectangle is in a range of 10 nm to 2000 nm, and a width of the rectangle is in a range of 10 nm to 10 μm.

6. The material structure for silicon-based gallium nitride microwave and millimeter-wave devices as claimed in claim 1, wherein a material of the buffer layer comprises gallium nitride, aluminum gallium nitride, or aluminum nitride; a thickness of the buffer layer is in a range of 100 to 5000 nm, a material of the channel layer is gallium nitride, and a thickness of the channel layer is in a range of 10 to 1000 nm.

7. The material structure for silicon-based gallium nitride microwave and millimeter-wave devices as claimed in claim 1, wherein the composite barrier layer comprises:
    an isolation layer, disposed on the upper surface of the channel layer;
    a core barrier layer, disposed on an upper surface of the isolation layer; and
    a capping layer, disposed on an upper surface of the capping layer.

8. The material structure for silicon-based gallium nitride microwave and millimeter-wave devices as claimed in claim 1, wherein the composite barrier layer comprises:
    an isolation layer, disposed on the upper surface of the channel layer; and
    a core barrier layer, disposed on an upper surface of the isolation layer.

9. The material structure for silicon-based gallium nitride microwave and millimeter-wave devices as claimed in claim 1, wherein the composite barrier layer comprises:
    a core barrier layer, disposed on the upper surface of the channel layer; and
    a capping layer, disposed on an upper surface of the core barrier layer.

10. The material structure for silicon-based gallium nitride microwave and millimeter-wave devices as claimed in claim 1, wherein the side of the first portion is filled into the plurality of second grooves to be in contact with the sides and the bottoms of the plurality of second grooves of the buffer layer, and the opposite side of the second portion is filled into the plurality of first grooves to be in contact with the sides and the bottoms of the plurality of first grooves of the silicon substrate.

11. The material structure for silicon-based gallium nitride microwave and millimeter-wave devices as claimed in claim 1, wherein the buffer layer is an iron (Fe) doped buffer layer, a dislocation density of the buffer layer is $11 \times 10^9$ cm$^{-2}$, and a resistivity of the buffer layer is 1 MΩ·cm; the channel layer is an unintentionally doped GaN channel layer, and a thickness of the channel layer is 300 nm; and a size of the silicon substrate is 8 inches, a thickness of the silicon substrate is 725 μm, a resistivity of the silicone substrate is 5000 Ω·cm, and a target crystal orientation of the silicon substrate is [111].

12. The material structure for silicon-based gallium nitride microwave and millimeter-wave devices as claimed in claim 1, wherein shapes of the plurality of first and second grooves each are a rectangle, a depth of the rectangle is 500 nm, and a width of the rectangle is 1 μm; and a ratio of an area of the plurality of first grooves to an area of the surface of the silicon substrate disposed with the dielectric layer is 50%; and a ratio of an area of the plurality of second grooves to an area of the surface of the buffer layer disposed with the dielectric layer is 50%.

13. A material structure for silicon-based gallium nitride microwave and millimeter-wave devices, comprising:
    a silicon substrate;
    a dielectric layer, comprising a lower surface and an opposite upper surface, wherein the lower surface is in contact with the silicon substrate;
    a buffer layer, disposed in contact with the upper surface of the dielectric layer;
    a channel layer, disposed in contact with the buffer layer; and
    a composite barrier layer, disposed in contact with the channel layer, and whereby the channel layer is located between the buffer layer and the composite barrier layer;
    wherein the lower surface of the dielectric layer contacting with the silicon substrate and the upper surface of the dielectric layer contacting with the buffer layer both are uneven surfaces, and each of the uneven surfaces is a surface formed with a plurality of grooves; the silicon substrate is filled into the plurality of grooves of the lower surface of the dielectric layer, and in direct contact with side walls and bottoms of the plurality of grooves of the lower surface of the dielectric layer; and the buffer layer is filled into the plurality of grooves of the upper surface of the dielectric layer, and in direct contact with side walls and bottoms of the plurality of grooves of the upper surface of the dielectric layer; and
    wherein the dielectric layer is a bi-layered structure, and comprises: a first portion and a second portion, which are made from a same material and bonded together by wafer bonding; the lower surface of the dielectric layer is a lower surface of the second portion, and the upper surface of the dielectric layer is an upper surface of the first portion; and an upper surface of the second portion is in contact with a lower surface of the first portion.

14. The material structure for silicon-based gallium nitride microwave and millimeter-wave devices as claimed in claim 13, wherein the buffer layer is filled into the plurality of grooves of the upper surface of the first portion to be in contact with the side walls and the bottoms of the plurality of grooves of the upper surface of the first portion; and the silicon substrate is filled into the plurality of grooves of the lower surface of the second portion to be in contact with the side walls and the bottoms of the plurality of grooves of the lower surface of the second portion.

15. The material structure for silicon-based gallium nitride microwave and millimeter-wave devices as claimed in claim 13, wherein the buffer layer is an iron (Fe) doped buffer layer, a dislocation density of the buffer layer is $11 \times 10^9$ cm$^{-2}$, and a resistivity of the buffer layer is 1 MΩ·cm; the channel layer is an unintentionally doped GaN channel layer, and a thickness of the channel layer is 300 nm; and a size of the silicon substrate is 8 inches, a thickness of the silicon substrate is 725 μm, a resistivity of the silicone substrate is 5000 Ω·cm, and a target crystal orientation of the silicon substrate is [111].

16. The material structure for silicon-based gallium nitride microwave and millimeter-wave devices as claimed in claim 13, wherein a shape of each of the plurality of grooves is a rectangle, a depth of the rectangle is 500 nm, and a width of the rectangle is 1 μm; and a ratio of an area of the plurality of grooves of the lower surface of the dielectric layer to an area of the lower surface of the dielectric layer is 50%; and a ratio of an area of the plurality of grooves of the upper surface of the dielectric layer to the upper surface of the dielectric layer is 50%.

* * * * *